United States Patent
Gluschenkov et al.

(10) Patent No.: US 10,685,961 B2
(45) Date of Patent: Jun. 16, 2020

(54) CONTACT FORMATION IN SEMICONDUCTOR DEVICES

(71) Applicant: International Business Machines Corporation, Armonk, NY (US)

(72) Inventors: Oleg Gluschenkov, Tannersville, NY (US); Zuoguang Liu, Schenectady, NY (US); Hiroaki Niimi, Cohoes, NY (US); Joseph S. Washington, Raleigh, NC (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/365,913

(22) Filed: Mar. 27, 2019

(65) Prior Publication Data

US 2019/0221565 A1    Jul. 18, 2019

Related U.S. Application Data

(62) Division of application No. 15/466,358, filed on Mar. 22, 2017, now Pat. No. 10,319,722.

(51) Int. Cl.
*H01L 27/092* (2006.01)
*H01L 21/8238* (2006.01)
(Continued)

(52) U.S. Cl.
CPC .... *H01L 27/0924* (2013.01); *H01L 21/26506* (2013.01); *H01L 21/28518* (2013.01);
(Continued)

(58) Field of Classification Search
CPC ............. H01L 21/324; H01L 21/76802; H01L 21/76877; H01L 21/76895; H01L 21/8238;
(Continued)

(56) References Cited

U.S. PATENT DOCUMENTS 8,367,528 B2   2/2013   Bauer et al.
9,171,929 B2   10/2015   Lee et al.
(Continued)

FOREIGN PATENT DOCUMENTS

CN    103840005 A    6/2014
WO    2015142357 A1   9/2015

OTHER PUBLICATIONS

Chang et al., "Tensile-Strained Ge/SiGeSn Quantum Wells for Polarization-Insensitive Electro-Absorption Waveguide Modulators", IEEE Journal of Quantum Electronics, vol. 48, No. 4, Apr. 2012, pp. 533-541.
(Continued)

*Primary Examiner* — Matthew E Warren
(74) *Attorney, Agent, or Firm* — Cantor Colburn LLP; Vazken Alexanian

(57) ABSTRACT

A technique relates to fabricating a pFET device and nFET device. A contact trench is formed through an inter-level dielectric layer (ILD) and a spacer layer. The ILD is formed over the spacer layer. The contact trench exposes a p-type source/drain region of the pFET and exposes an n-type source/drain region of the NFET. A gate stack is included within the spacer layer. A p-type alloyed layer is formed on top of the p-type source/drain region in the pFET and on top of the n-type source/drain region of the nFET. The p-type alloyed layer on top of the n-type source/drain region of the nFET is converted into a metallic alloyed layer. A metallic liner layer is formed in the contact trench such that the metallic liner layer is on top of the p-type alloyed layer of the pFET and on top of the metallic alloyed layer of the nFET.

16 Claims, 13 Drawing Sheets

(51) Int. Cl.

| | | |
|---|---|---|
| *H01L 21/324* | (2006.01) | |
| *H01L 21/768* | (2006.01) | |
| *H01L 29/06* | (2006.01) | |
| *H01L 23/535* | (2006.01) | |
| *H01L 21/265* | (2006.01) | |
| *H01L 29/165* | (2006.01) | |
| *H01L 29/45* | (2006.01) | |
| *H01L 21/285* | (2006.01) | |
| *H01L 29/66* | (2006.01) | |

(52) U.S. Cl.
CPC ...... *H01L 21/324* (2013.01); *H01L 21/76814* (2013.01); *H01L 21/76877* (2013.01); *H01L 21/76895* (2013.01); *H01L 21/76897* (2013.01); *H01L 21/823814* (2013.01); *H01L 21/823821* (2013.01); *H01L 21/823864* (2013.01); *H01L 21/823871* (2013.01); *H01L 21/823878* (2013.01); *H01L 23/535* (2013.01); *H01L 27/092* (2013.01); *H01L 29/0649* (2013.01); *H01L 29/165* (2013.01); *H01L 29/45* (2013.01); *H01L 21/76843* (2013.01); *H01L 21/76855* (2013.01); *H01L 29/66545* (2013.01)

(58) Field of Classification Search
CPC ..... H01L 21/823821; H01L 21/823864; H01L 21/823871; H01L 27/0924
USPC .......................... 438/586, 597, 658–660, 675
See application file for complete search history.

(56) References Cited

U.S. PATENT DOCUMENTS

| | | | |
|---|---|---|---|
| 9,224,735 B2 | 12/2015 | Glass et al. | |
| 9,502,309 B1 * | 11/2016 | Cheng | H01L 21/82387 |
| 2004/0082168 A1 | 4/2004 | Lee et al. | |
| 2007/0138564 A1 * | 6/2007 | Lim | H01L 21/76843 |
| | | | 257/369 |
| 2007/0170588 A1 | 7/2007 | Goto et al. | |
| 2009/0209096 A1 | 8/2009 | Lee et al. | |
| 2010/0123198 A1 * | 5/2010 | Kim | H01L 21/26506 |
| | | | 257/377 |
| 2011/0057317 A1 | 3/2011 | Koike et al. | |
| 2011/0068407 A1 | 3/2011 | Yeh et al. | |
| 2012/0211808 A1 | 8/2012 | Wei et al. | |
| 2013/0154016 A1 | 6/2013 | Glass et al. | |
| 2013/0183814 A1 | 7/2013 | Huang et al. | |
| 2014/0001520 A1 | 1/2014 | Glass et al. | |
| 2014/0008730 A1 | 1/2014 | Mitard et al. | |
| 2014/0183645 A1 | 7/2014 | Wann et al. | |
| 2016/0111537 A1 | 4/2016 | Tsai et al. | |
| 2016/0181424 A1 | 6/2016 | Rios et al. | |
| 2017/0256624 A1 * | 9/2017 | Lee | H01L 29/47 |
| 2018/0005903 A1 * | 1/2018 | Basker | H01L 21/82387 |
| 2018/0277483 A1 | 9/2018 | Gluschenkov et al. | |
| 2018/0277541 A1 | 9/2018 | Gluschenkov et al. | |
| 2019/0148299 A1 | 5/2019 | Gluschenkov et al. | |

OTHER PUBLICATIONS

Driesch et al., "Direct Bandgap Group IV Epitaxy on Si for Laser Applications", Chemistry of Materials, ACS Publications, American Chemical Society, DOI: 10.1021/acs.chemmater.5b01327, pp. 1-10.

Giubertoni et al., "Solid Phase Epitaxial Re-Growth of Sn Ion Implanted Germanium Thin Films", Proc. AIP Conference, vol. 1496, 2012, pp. 103-106.

Gupta et al., "7-nm FinFET CMOS Design Enabled by Stress Engineering Using Si, Ge, and Sn", IEEE Transactions on Electron Devices, vol. 61, No. 5, May 2014, pp. 1222-1230.

Gupta et al., "GeSn channel nMOSFETs: Material Potential and Technological Outlook", Proc. IEEE Symposium on VLSI Technology (VLSIT), 2012, pp. 95-96.

Oleg Gluschenkov et al., "Contact Formation in Semiconductor Devices," U.S. Appl. No. 16/226,911, filed Dec. 20, 2018.

Secchi et al., "Ge nanostructuring by Sn ion implantation", Proc. IEEE 15th Intl. Conf. on Nanotechnology(IEEE—Nano), Jul. 27-30, 2015, Rome, Italy, pp. 522-525.

Trumbore, "Solid Solubilities of Impurity Elements in Germanium and Silicon", The Bell System Technical Journal, Jan. 1960, pp. 1-29.

List of IBM Patents or Patent Applications Treated As Related; (Appendix P), Filed Mar. 27, 2019; 2 pages.

* cited by examiner

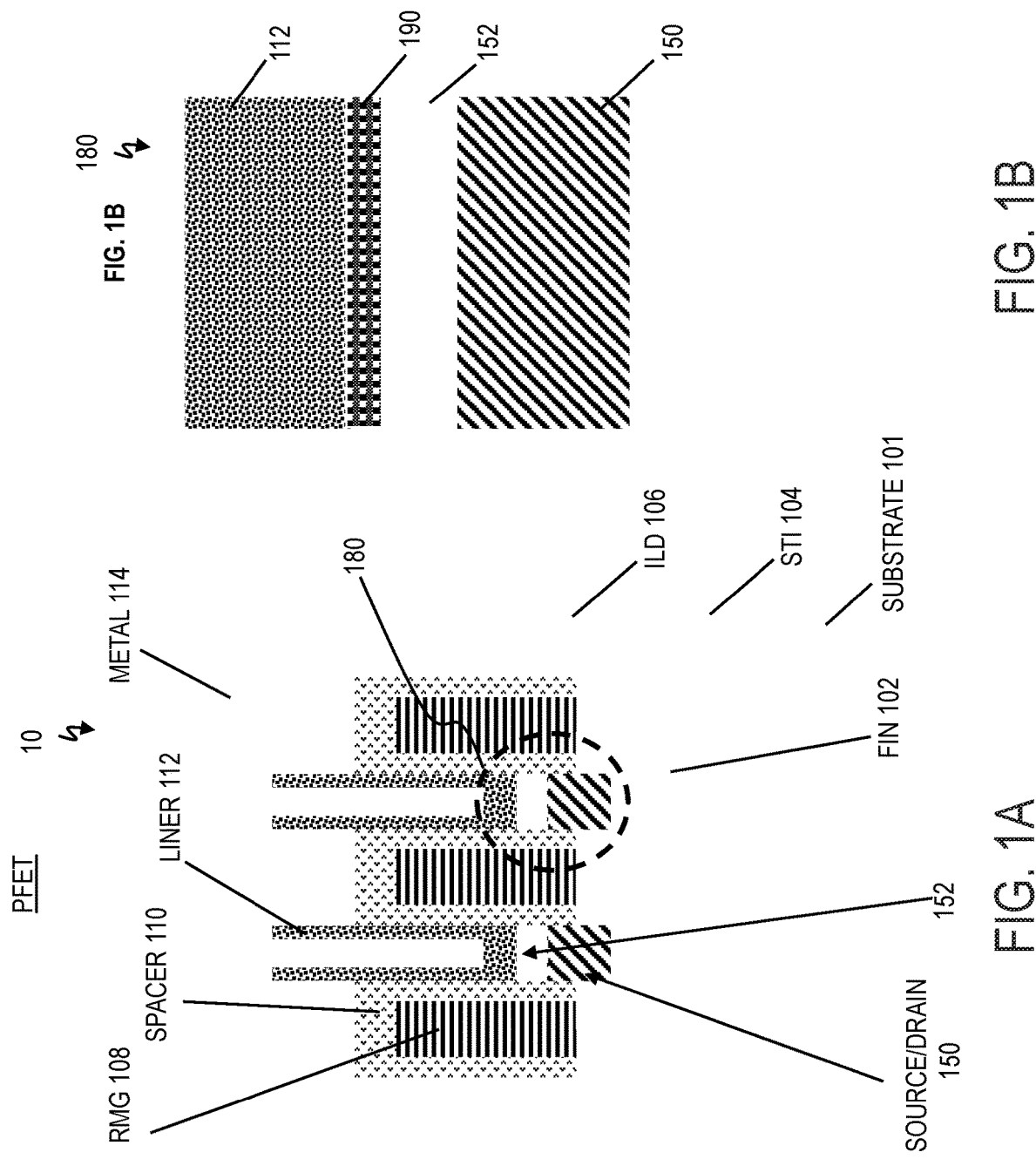

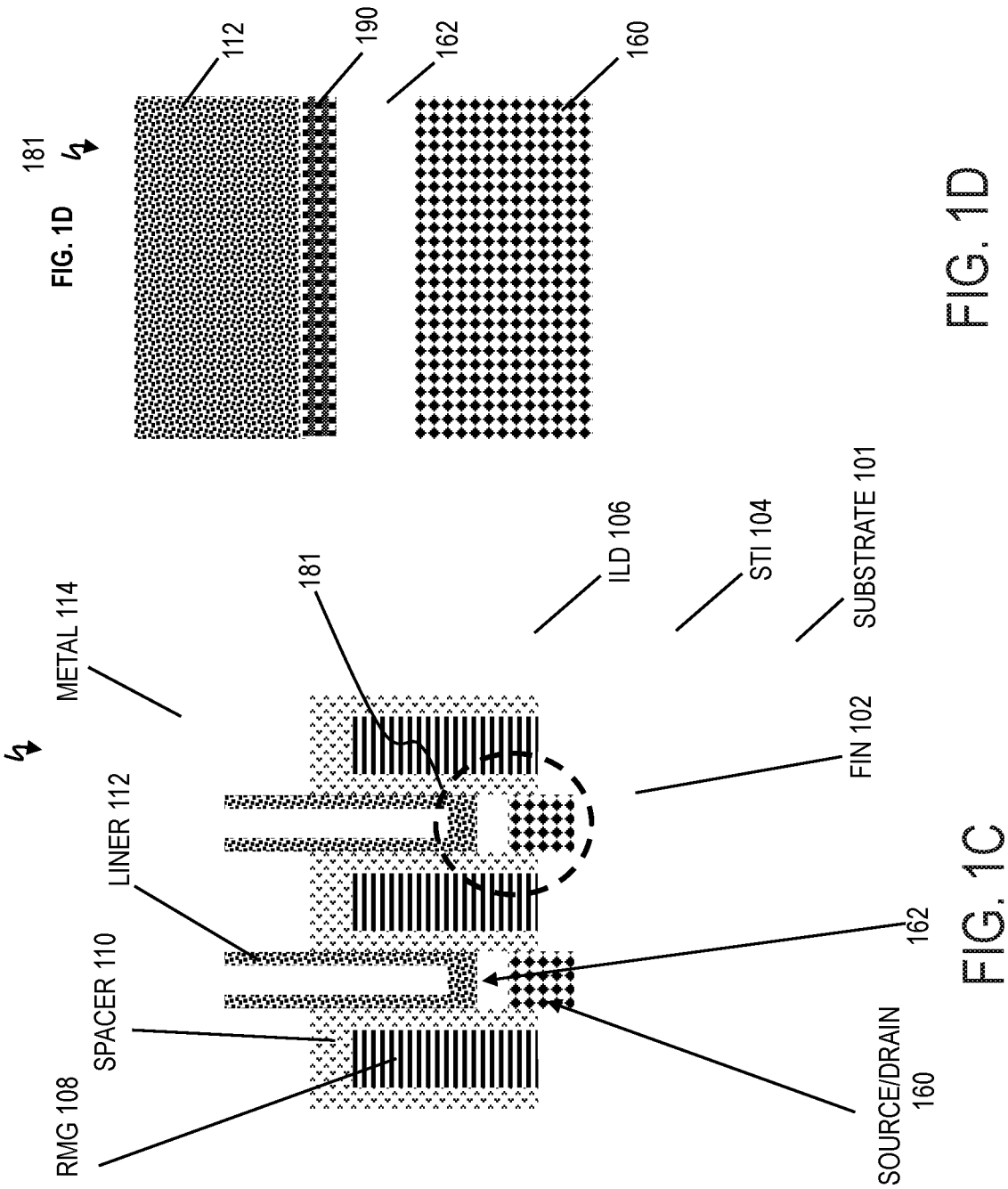

1200

FORM A CONTACT TRENCH THROUGH AN INTER-LEVEL DIELECTRIC LAYER AND A SPACER LAYER, THE INTER-LEVEL DIELECTRIC LAYER FORMED OVER THE SPACER LAYER, THE CONTACT TRENCH EXPOSING A P-TYPE SOURCE/DRAIN REGION OF THE PFET DEVICE AND EXPOSING AN N-TYPE SOURCE/DRAIN REGION OF THE NFET DEVICE, WHEREIN A GATE STACK IS INCLUDED WITHIN THE SPACER LAYER  1202

↓

FORM A P-TYPE ALLOYED LAYER ON TOP OF THE P-TYPE SOURCE/DRAIN REGION IN THE PFET DEVICE AND ON TOP OF THE N-TYPE SOURCE/DRAIN REGION OF THE NFET DEVICE  1204

↓

CONVERT THE P-TYPE ALLOYED LAYER ON TOP OF THE N-TYPE SOURCE/DRAIN REGION OF THE NFET DEVICE INTO A METALLIC ALLOYED LAYER ON TOP OF THE N-TYPE SOURCE/DRAIN REGION  1206

↓

FORM A METALLIC LINER LAYER IN THE CONTACT TRENCH SUCH THAT THE METALLIC LINER LAYER IS ON TOP OF THE P-TYPE ALLOYED LAYER OF THE PFET DEVICE AND ON TOP OF THE METALLIC ALLOYED LAYER OF THE NFET DEVICE  1208

FIG. 12

CONTACT FORMATION IN SEMICONDUCTOR DEVICES

DOMESTIC PRIORITY

This application is a divisional of U.S. patent application Ser. No. 15/466,358, filed Mar. 22, 2017, the disclosure of which is incorporated by reference herein in its entirety.

BACKGROUND

The present invention generally relates to complimentary metal-oxide semiconductors (CMOS) and metal-oxide-semiconductor field-effect transistors (MOSFET), and more specifically, to contact formation during geometrically-scaled FET device fabrication.

The MOSFET is a transistor used for switching electronic signals. The finFET is a multiple-gate MOSFET device that mitigates the effects of short channels and reduces drain-induced barrier lowering. Due to improved short channel effects, the finFET is a widely used form of geometrically-scaled FETs. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length (gate width) can be achieved in a given region of the substrate as opposed to a planar FET device. However, geometrically-scaled FETs suffer from increased series, parasitic resistance. A large component of this parasitic resistance is the contact resistance between metallic interconnects and a semiconductor material of FET body. There is a continuous need for novel techniques and structures enabling lower contact resistance for geometrically-scaled FETs.

SUMMARY

According to one or more embodiments, a method for fabricating a p-type field effect transistor (pFET) device and an n-type field effect transistor (nFET) device is provided. The method includes forming a contact trench through an inter-level dielectric layer and a spacer layer, where the inter-level dielectric layer is formed over the spacer layer. The contact trench exposes a p-type source/drain region of the pFET device and exposes an n-type source/drain region of the NFET device. A gate stack is included within the spacer layer. The method includes forming a p-type alloyed layer on top of the p-type source/drain region in the pFET device and on top of the n-type source/drain region of the nFET device and converting the p-type alloyed layer on top of the n-type source/drain region of the nFET device into a metallic alloyed layer on top of the n-type source/drain region. Also, the method includes forming a metallic liner layer in the contact trench such that the metallic liner layer is on top of the p-type alloyed layer of the pFET device and on top of the metallic alloyed layer of the nFET device.

According to one or more embodiments, a semiconductor device is provided. The semiconductor device includes an inter-level dielectric layer formed over a spacer layer such that a contact trench is through the inter-level dielectric layer and the spacer layer. The contact trench exposes a p-type source/drain region of a pFET device and exposes an n-type source/drain region of an nFET device. A gate stack is included within the spacer layer. The semiconductor device includes a p-type alloyed layer on top of the p-type source/ drain region of the pFET device and a metallic alloyed layer on top of the n-type source/drain region of the nFET device. The metallic alloyed layer has been converted from the p-type alloyed layer. The semiconductor device includes a metallic liner layer in the contact trench such that the metallic liner layer is on top of the p-type alloyed layer of the pFET device and on top of the metallic alloyed layer of the nFET device.

According to one or more embodiments, a method of making a metallic metastable alloy is provided. The method includes forming an amorphous layer of Ge and implanting Sn and a dopant "J" in the amorphous layer. Further, the method includes performing a nanosecond-scale laser metal anneal that causes the amorphous layer to liquefy and causes liquid phase epitaxial re-growth, thereby resulting in a metallic metastable GeSn"J" alloy in which Ge is greater than 60 atomic %, Sn is greater than 30 atomic %, and J is a remainder atomic % so as to total 100 atomic %.

BRIEF DESCRIPTION OF THE DRAWINGS

FIG. 1A is a cross-sectional view of a pFET device according to one or more embodiments.

FIG. 1B is an enlarged view of the contacts in the trench of the pFET device according to one or more embodiments.

FIG. 1C is a cross-sectional view of an nFET device according to one or more embodiments.

FIG. 1D is an enlarged view of the contacts in the trench of the nFET device according to one or more embodiments.

FIG. 2 is a cross-sectional view of the pFET device and the nFET device illustrating a p-type source/drain region and an n-type source drain region in a contact trench according to one or more embodiments.

FIG. 3 is a cross-sectional view illustrating trench epitaxial growth according to one or more embodiments FIG. 4 is a cross-sectional view of the pFET device and nFET device illustrating formation of a protective block over the pFET device according to one or more embodiments.

FIG. 5 is a cross-sectional view of the pFET device and nFET device illustrating ion implantation to form a pre-trench alloyed layer in the contact trench of the nFET device according to one or more embodiments.

FIG. 6 is a cross-sectional view of the pFET device and nFET device illustrating removal of the protective block according to one or more embodiments.

FIG. 7 is a cross-sectional view of the pFET device and nFET device illustrating annealing to form the p-type trench alloyed layer in the pFET device and the n-type trench alloyed layer in the nFET device according to one or more embodiments.

FIG. 8 is a cross-sectional view of the pFET device and nFET device illustrating deposition of a metallic liner layer according to one or more embodiments.

FIG. 9 is a cross-sectional view of the pFET device and nFET device illustrating deposition of a conductive contact material over the liner layer according to one or more embodiments.

FIG. 10 is a cross-sectional view of the pFET device and nFET device illustrating a planarization process that removes overburdened materials and forms conductive contacts according to one or more embodiments.

FIG. 12 is a flow chart of a method for fabricating the pFET device and the nFET device according to one or more embodiments.

DETAILED DESCRIPTION

Figure 2:
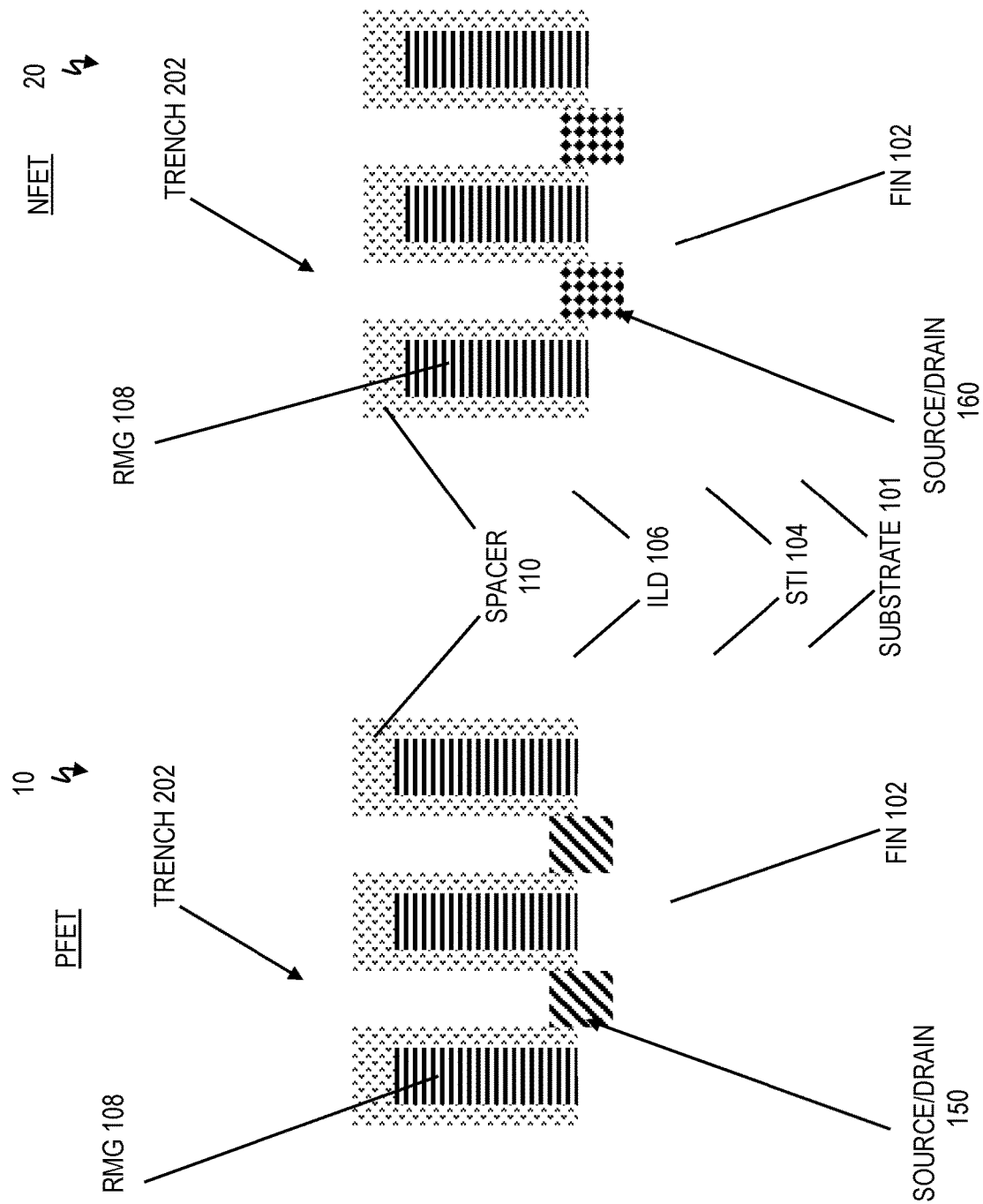
FIGS. 2-10 illustrate an exemplary method of forming the pFET device and nFET device with reduced contact resistance on the same wafer/substrate according to one or more embodiments.

As previously noted herein, the MOSFET is a transistor used for switching electronic signals. The MOSFET has a source, a drain and a gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET has n-doped source and drain junctions and uses electrons as the current carriers. The pFET has p-doped source and drain junctions and uses holes as the current carriers.

The finFET is a type of MOSFET. The finFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length can be achieved in a given region of the substrate as opposed to a planar FET device. Due to improved short channel effects, the finFET is a widely used form of geometrically-scaled FETs.

Gate spacers form an insulating film along the gate sidewalls. Gate spacers can also initially be formed along sacrificial gate sidewalls in replacement gate technology. The gate spacers are used to define source/drain regions in active areas of a semiconductor substrate located adjacent to the gate.

The source/drain regions are often formed using a highly doped semiconductor material. The choice of source/drain semiconductor material is dictated by two factors (1) its compatibility with the transistor channel and (2) minimizing series resistance within the source/drain material. Device scaling in the semiconductor industry reduces costs per transistor, decreases power consumption and provides faster devices with increased functions per unit area. Improvements in optical lithography used to play a major role in device scaling enabling smaller geometrical features. However, increases in parasitic resistance and capacitance associated with the smaller geometrical features reduced or eliminated the positive effects of purely geometrical scaling. Materials advances directed toward reducing parasitic components of resistance and capacitance are now an integral part of device scaling.

In any FET device, a conductive contact is formed to the source/drain regions to connect the FET device to a circuit. The conductive contact is often formed by forming a trench in an insulator layer to expose the source/drain region. The trench is often formed using an etching process that can damage the underlying substrate while removing portions of the insulator layer. There are several material interfaces within the contact structures. Each of these interfaces creates free carrier scattering and introduces a resistance to the current flow. This interfacial resistance is often referred to as the contact resistance. A typical contact resistance of metal-metal interfaces is from $10^{-10}$ to $10^{-11}$ Ohm-cm$^2$. A typical contact resistance of metal-semiconductor interfaces is from $10^{-7}$ to $10^{-9}$ Ohm-cm$^2$. A typical contact resistance of semiconductor-semiconductor interfaces is from $10^{-9}$ to $10^{-10}$ Ohm-cm$^2$. Accordingly, the main effort has been directed toward reducing metal-semiconductor contact resistance.

In previous p-finFET devices, a source/drain region is formed by epitaxially growing a SiGe material on the exposed fins. A trench Ge material can be formed over the SiGe material that provides a unipolar heterojunction interface between the SiGe material and the Ge material, which is a semiconductor-semiconductor interface. The trench Ge material enables a lower semiconductor-metal interfacial (contact) resistance due to metal Fermi level pinning to Ge valence band. However, the trench Ge material undesirably increases the interfacial (contact) resistance of n-finFET devices causing difficulty of simultaneously forming the pFET device and nFET device with reduced contact resistance on the same wafer/substrate.

The illustrated exemplary methods and embodiments described herein provide for the formation of a contact over both the source/drain regions of a pFET device and an nFET device. The trench source/drain regions of nFET devices are alloyed with tin (Sn) in such a way that the resultant GeSn alloy becomes metallic forming n-type-semiconductor to metal contact with reduced contact resistance.

FIG. 1A is a cross-sectional view of a pFET device 10 according to one or more embodiments. FIG. 1B is an enlarged view of the contacts in the trench of the pFET device 10. FIG. 1C is a cross-sectional view of an nFET device 20 according to one or more embodiments. FIG. 1D is an enlarged view of the contacts in the trench of the nFET device 20. The pFET device 10 and nFET device 20 include a substrate/wafer 101 on which fins 102 are formed. The pFET device 10 and nFET device 20 are formed on the same wafer. In one embodiment, the fins 102 might not be formed in the substrate 101. In an alternate exemplary embodiment, a semiconductor on insulator substrate can be used. Although the illustrated embodiments show a bulk semiconductor substrate 101, alternative exemplary embodiments can include a semiconductor on insulator wafer arrangement.

Non-limiting examples of suitable materials for the substrate/wafer 101 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

As understood by one skilled in the art, the fins 102 can be formed by lithographic patterning and etching process. The fins 102 are formed by, for example, a photolithographic patterning and etching process such as reactive ion etching process that patterns a resist on a hardmask and removes exposed portions of the hardmask and the substrate 101 to form the fins 102. The fins 102 for the pFET device 10 can have a different doping than the fins 102 forming the nFET device 20.

Shallow trench isolation (STI) regions 104 are adjacent to the fins 102. In an embodiment not having fins 102, the STI regions 104 are in the substrate 101. The STI region 104 can be formed by, any suitable process including, for example, lithography or etching to form trenches, and then filling the trenches with an insulating material, such as silicon dioxide. In an embodiment, at least one isolation region is a shallow trench isolation region ("STI"). However, the isolation region 104 can be a trench isolation region, a field oxide isolation region (not shown), or any other type of isolation region. The isolation region 104 provides isolation between neighboring gate structure regions, and can be used when the neighboring gates have opposite conductivities, e.g., nFETs and pFETs. As such, the isolation region 104 separates an nFET device region from a pFET device region.

The pFET device 10 and the nFET device 20 include an inter-level dielectric layer (ILD) 106, spacer layer 110, replacement metal gates 108, liner 112, and metal 114.

The pFET device 10 includes a p-type source/drain (S/D) region 150, an alloyed layer 152, and a liner layer 112 all of which are shown in an enlarged view 180 in FIG. 1B. In one implementation, the enlarged view 180 in FIG. 1B illustrates that there can be an interfacial layer 190 that is formed between the alloyed layer 152 and the liner layer 112. In one case, if the liner layer 112 is Ti (titanium) and the alloyed layer 152 is Ge:Ga (which means germanium doped with gallium) or the alloyed layer 152 is GeSn:Ga (which means a germanium tin alloy doped with gallium), then a thin titanium germanium (TiGe$_x$) interfacial layer 190 could be formed. The gallium dopant in alloyed layer 152 can be substituted with other p-type dopants such as boron (B), aluminum (Al), indium (In) and/or any combination thereof. Both gallium and aluminum have a high solid solubility in germanium and therefore preferred (although not a necessity) alloying dopants for the alloyed layer 152.

The nFET device 20 includes an n-type source/drain (S/D) region 160, an alloyed layer 162, and liner layer 112 all of which are shown in an enlarged view 181 in FIG. 1D. In one implementation, the enlarged view 181 in FIG. 1D illustrates that there might be an interfacial layer 190 that is formed between the alloyed layer 162 and the liner layer 112. In one case, if the liner layer 112 is Ti (titanium) and the alloyed layer 162 is metallic GeSn metastable material, then a thin titanium germanium interfacial layer 190 could be formed. The metallic GeSn metastable material can contain both p-type and n-type dopants for Group IV semiconductors. The presence of dopants in alloyed layer 162 is not required but may provide advantages in building pFET device 10 and nFET device 20 on the same substrate and further improve the contact resistance. The p-type dopants are the same as in the alloyed layer 152 while n-type dopants include phosphorus (P), arsenic (As), antimony (Sb), and/or any combination thereof. Phosphorus and arsenic are preferred (although not a necessity) n-type dopants for both S/D region 160 and layer 162.

FIGS. 2-10 illustrate an exemplary method of (simultaneously) forming the pFET device 10 and nFET device 20 with reduced contact resistance on the same wafer/substrate 101 according to one or more embodiments. The pFET device 10 and nFET device 20 appear to be separated for illustration purposes.

In FIG. 2, the fins 102, the spacers 110, the inter-level dielectric layer (ILD) 106, the shallow trench isoloation regions 104, and the replacement metal gates 108 are formed using conventional processes as understood by one skilled in the art.

The replacement metal gate 108 is a gate stack. The gate stack typically includes high-k metal gates formed, for example, with one or more gate dielectric materials, one or more workfunction metals on the gate dielectric materials, and one or more metal gate conductor materials. The gate dielectric material(s) can be a dielectric material having a dielectric constant greater than 3.9, 7.0, or 10.0. Non-limiting examples of suitable materials for the gate dielectric materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The gate dielectric material layer can have a thickness in a range from about 0.5 to about 20 nm.

In the RMG, 108, the work function metal(s) can be disposed over the gate dielectric material. The type of work function metal(s) depends on the type of transistor and can differ between the nFET and pFET devices. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

In the RMG 108, the gate conductor material(s) is deposited over the gate dielectric material(s) and work function metal(s) to form the gate stack. Non-limiting examples of suitable conductive metals include aluminum (Al), platinum (Pt), gold (Au), tungsten (W), cobalt (Co), titanium (Ti), or any combination thereof. The gate conductor material(s) can be deposited by a suitable deposition process, for example, CVD, PECVD, PVD, plating, thermal or e-beam evaporation, and sputtering.

Following the deposition of the gate dielectric materials, the work function metal(s), and the gate conductor material(s), a planarization process, for example, chemical mechanical planarization (CMP), is performed to remove the overburden of the deposited gate materials and form the gate stack.

The inter-level dielectric layer 106 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 106 can be deposited by a deposition process, including, but not limited to CVD, PVD, plasma enhanced CVD, atomic layer deposition (ALD), evaporation, chemical solution deposition, or like processes.

Trenches 202 are formed in the spacers 110 down to the fins 102, such that portions of the fins 102 are exposed. The trenches 202 can be formed using self-aligned contact reactive ion etching (RIE). Non-limiting examples of suitable materials for the spacer material of spacers 110 include dielectric nitrides (e.g., silicon nitride), dielectric oxynitrides, SiBCN, SiOCN, SiOC, dielectric oxides (e.g., silicon oxide), or any combination thereof. The layer of spacer material is deposited by a suitable deposition process, for example, chemical vapor deposition (CVD) or atomic layer deposition (ALD).

In the trenches 202, the exposed fin structures 102 are in between the replacement metal gates 108. The trenches 202 are aligned over the doped source/drain regions 150 and 160, so as to expose the doped source/drain regions 150 and 160. The doped source/drain regions 150 and 160 were previously formed via an epitaxial growth process that deposits a crystalline overlayer of semiconductor material onto the exposed crystalline seed material of the exposed fin 102.

In the illustrated exemplary embodiment, the source/drain region 150 includes SiGe material (e.g., doped with B) that can form a pFET device 10. The p-type source/drain region 150 is shown as the bottom of the trench 202 and is formed in a portion of the fin 102.

The source/drain region 160 includes Si material (e.g., doped with P) that can form an nFET device 20. The n-type source/drain region 160 is shown as the bottom of the trench 202 and is formed in a portion of the fin 102. The phosphorous (P) can be added and/or activated in the source/drain region 160 by through-trench epitaxial growth, ion implantation, laser-induced solid phase epitaxial re-growth (SPE), and laser-induced liquid phase epitaxial re-growth (LPE).

The specific composition of the source/drain material is selected to enable a low-resistivity current path to and from the transistor channel. In the pFET 10, the pFET source/drain material of the source/drains 150 is a highly-doped SiGe material with Ge content from about 33% to about 75%. The p-type dopant concentration in the source/drain can range from $1 \times 10^{19}$ cm$^{-3}$ to $2 \times 10^{21}$ cm$^{-3}$, or preferably (but not a necessity) between $2 \times 10^{20}$ cm$^{-3}$ and $1 \times 10^{21}$ cm$^{-3}$. The preferred (but not a necessity) p-type dopant for source/drain material is boron (B).

In the nFET 20, the nFET source/drains 160 are formed from another semiconductor material such as Si doped with P. In order to create both pFET and nFET source/drains using different epitaxial materials, the nFET fins 102 are blocked with a temperature-stable hard mask preventing epitaxial deposition of SiGe:B on nFET fins 102 when growing the source/drain regions 150, and correspondingly, the pFET fins 102 are blocked with a complementary temperature-stable hard mask preventing epitaxial deposition of Si:P on pFET fins 102 when growing the source/drain regions 160.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 3:
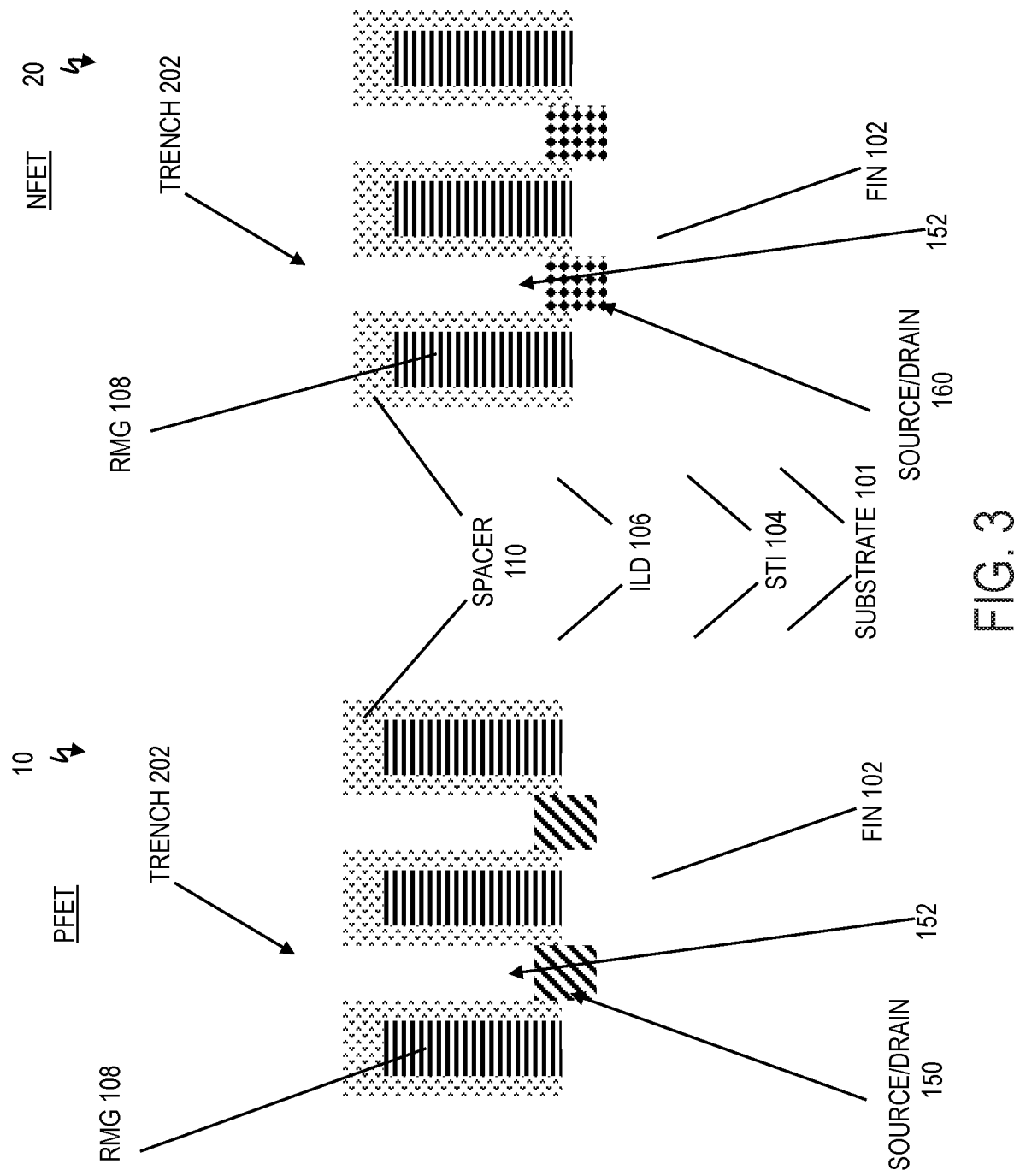

FIG. 3 is a cross-sectional view illustrating trench epitaxial growth according to one or more embodiments. Initially, the trench alloyed layer 152 is formed in the trenches 202 of both the pFET device 10 and the nFET device 20. The trench alloyed layer 152 can be Ge:Group III Dopant. In one case, the germanium can be an epitaxial layer in-situ doped with B, Al, or Ga. In another case, the germanium epitaxial layer can be doped by B, Al, Ga ion implantation along with SPE or LPE re-growth. The higher speed of SPE/LPE re-growth allows for incorporating a Group-III dopant well above its solubility limit resulting in a highly activated p-type semiconductor. Laser-induced SPE/LPE have high re-growth speed due to their short anneal duration and therefore a preferred method of forming alloyed layer 152. In FIG. 3, the trench alloyed layer 152 is the same in both the pFET device 10 and the nFET device 20.

Figure 4:
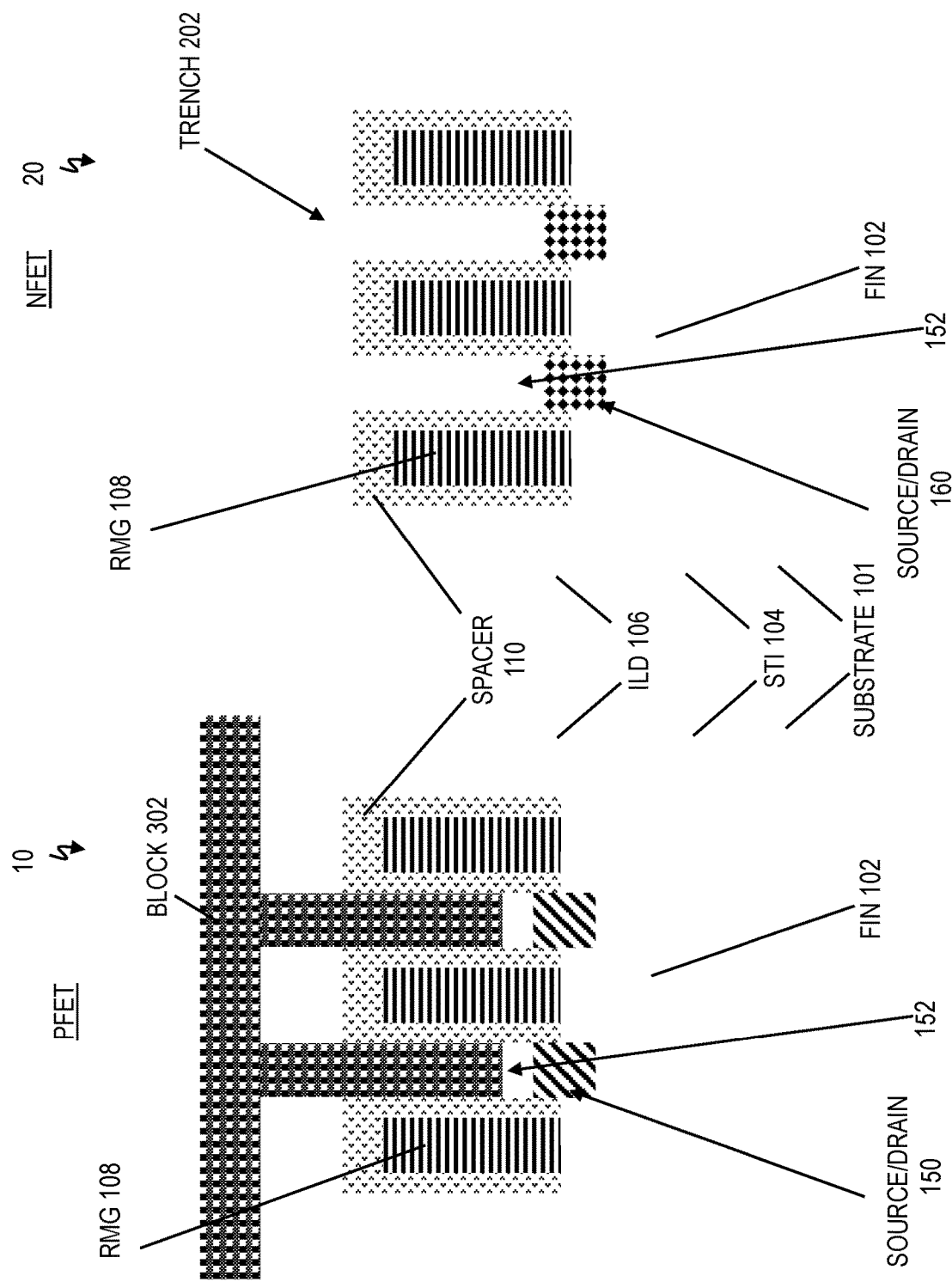

FIG. 4 is a cross-sectional view of the pFET device 10 and nFET device 20 illustrating formation of a block 302 according to one or more embodiments. The block 302 is formed in the trench 202 and on the inter-level dielectric layer 106 to protect the pFET device 10 for the next process to the nFET device 20. The block 302 can be a hard mask or any blocking polymer material. The block 302 can be an organic polymer material. No block is formed on the nFET device 20 and its trench 202 remains open.

Figure 5:
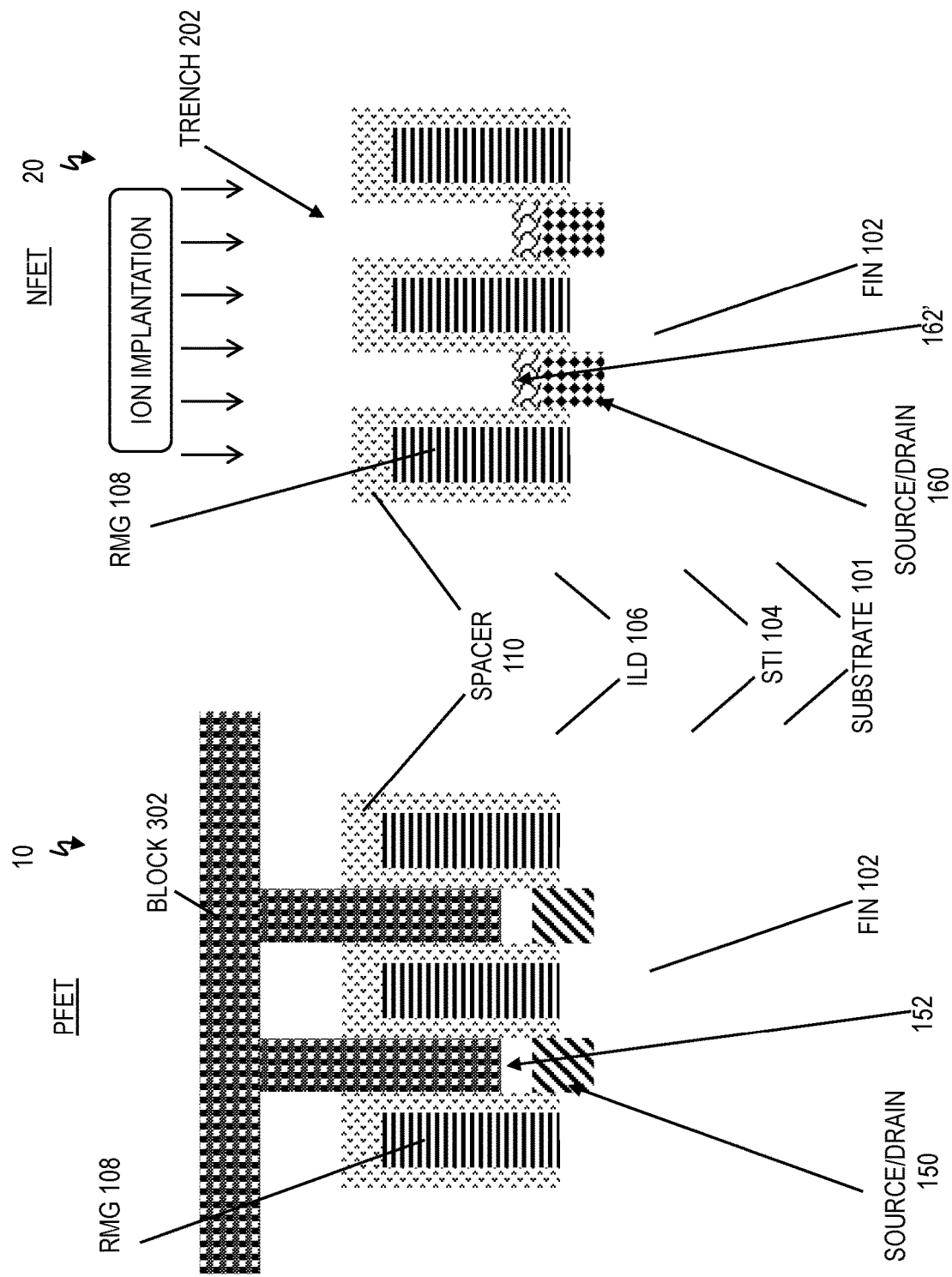

FIG. 5 is a cross-sectional view of the pFET device 10 and nFET device 20 illustrating ion implantation to form a pre-trench alloyed layer 162' according to one or more embodiments. While the block 302 protects the pFET device 10, the trench alloyed layer 152 in trench 202 of nFET device 20 is converted to pre-trench alloyed layer 162' by, for example, ion implantation. There is an ion implantation of Sn (tin) and an optional n-type dopant such as P (phosphorous) to form the pre-trench alloyed layer 162'. A portion of the phosphorus implant might penetrate into S/D region 160 while the energy of Sn implantation is selected to confine most of the implanted Sn atoms in layer 162'. The pre-trench alloyed layer 162' is an amorphous intermix of Ge, Sn, Group III dopant (p-type), and an optional Group V (n-type) dopant as a result of the ion implantation. As noted above, the pre-trench alloyed layer 162' in the nFET device 20 was previously the trench alloyed layer 152 of Ge:Group III dopant just as in the pFET device 10.

In one implementation, the amorphous intermix of Ge, Sn, and B in the pre-trench alloyed layer 162' can be Ge with about 65 atomic %, Sn with about 35 atomic %, and B with less than 1 atomic %.

In another implementation, the amorphous intermix of Ge, Sn, Ga, and P in the pre-trench alloyed layer 162' can be Ge with about 55-60 atomic %, Sn with about 30 atomic %, P with up to 10 atomic %, and the atomic % of P is greater that the atomic % of Ga. If Ga is 5 atomic %, then P is greater than 5 atomic %.

Figure 6:
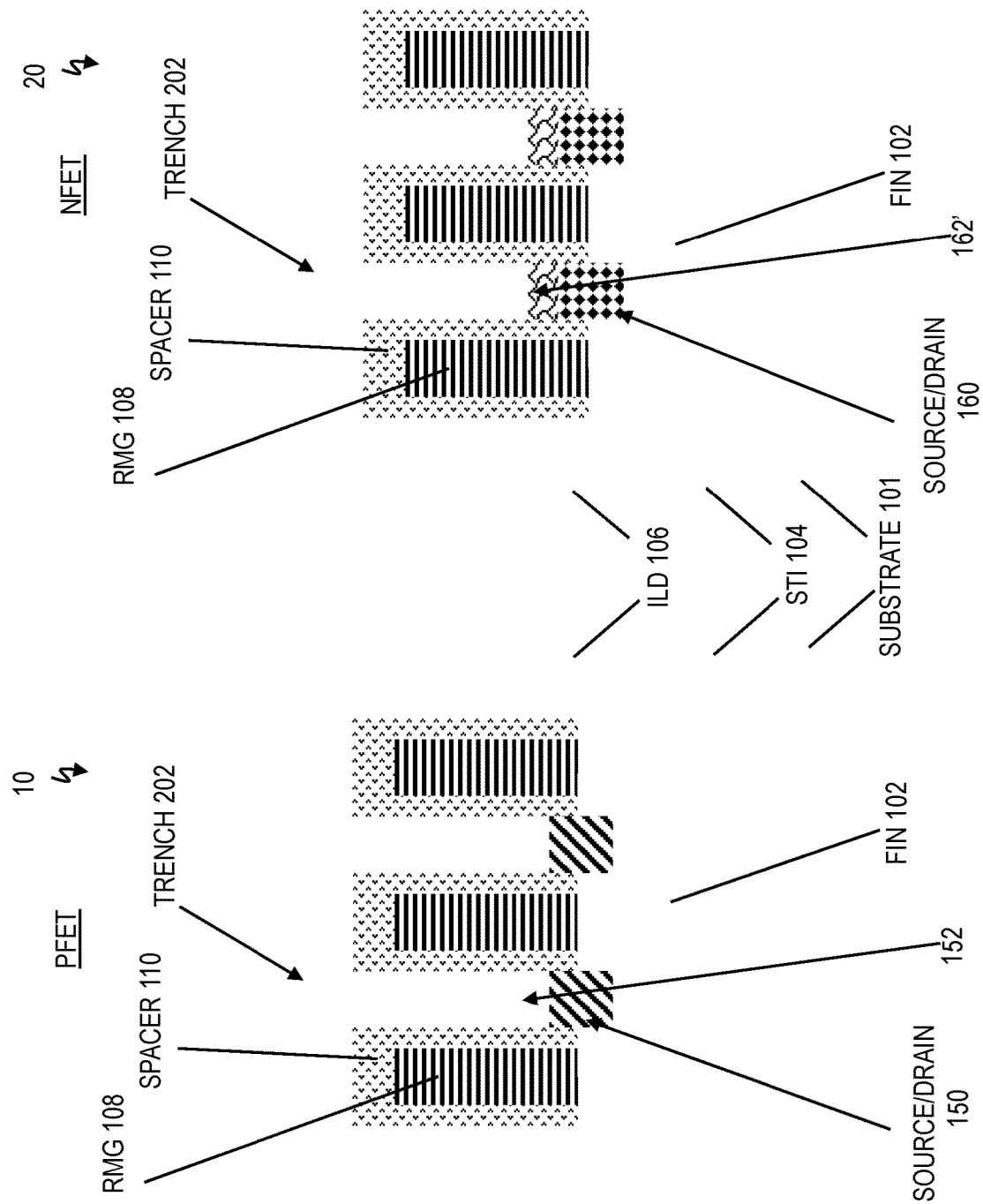

FIG. 6 is a cross-sectional view of the pFET device 10 and nFET device 20 illustrating removal of the block 302 according to one or more embodiments. Optionally, the removal of the block 302 can be by using dry ashing and/or wet chemistry that is selective to the exposed layers present on the wafer surface (for example, fin 102) as understood by one skilled in the art.

Figure 7:
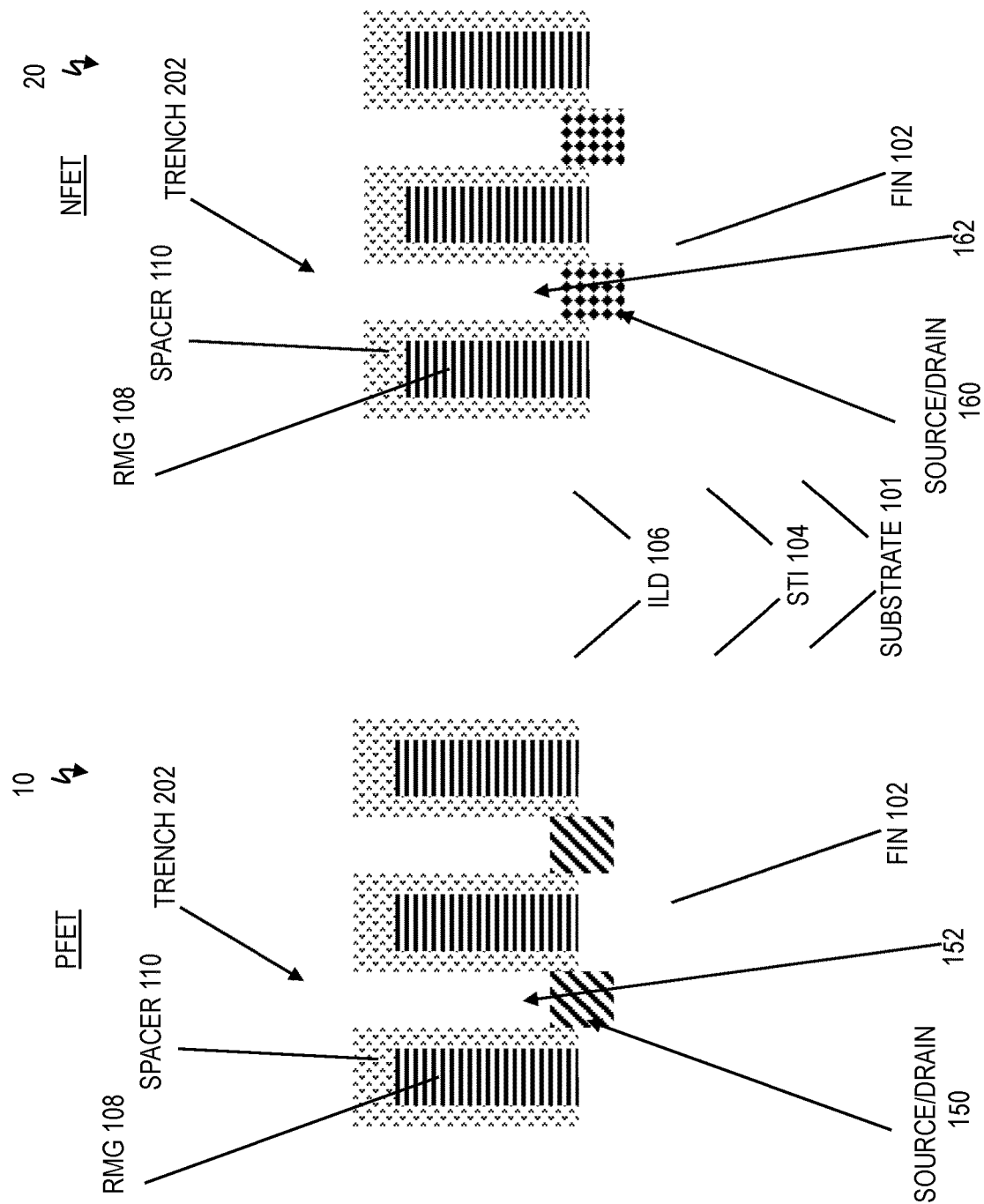

FIG. 7 is a cross-sectional view of the pFET device 10 and nFET device 20 illustrating annealing to form the trench alloyed layer 152 in the pFET device 10 and the trench alloyed layer 162 in the nFET device 20. The annealing of the amorphous intermix of Ge, Sn, Group III dopant, and optional Group V dopant of trench alloyed layer 162' results in a metallic trench alloyed layer 162. The metallic property of the trench alloyed layer 162 is achieved by alloying about 30 or more atomic % of Sn with a germanium-based doped semiconductor. The trench alloyed layer 162 is in highly metastable state because the tin chemical solid solubility in Ge does not exceed $5 \times 10^{20}$ cm$^{-3}$ atoms/cm$^3$ or about 1% atomic percent (reference can be made to "Solid Solubilities of Impurity Elements in Germanium and Silicon," by F. A. Trumbore in Bell Syst. Tech. J., 39, 205 (1960)). Chemical solid solubility of an element in a solid or crystal is a maximum amount of that element that can be uniformly dissolved in that solid or crystal at a given temperature. The maximum chemical solid solubility is taken at a particular temperature at which it reaches its maximum. If an element is incorporated into a solid or crystal in excess of its chemical solid solubility by some non-equilibrium means, e.g. by ion implantation, the excess amount will agglomerate, segregate, or precipitate into a separate phase upon heating. Materials that have a homogeneous solid mixture of elements in excess of their chemical solid solubility are metastable. The degree of their metastability depends on the excess amount above the chemical solubility limit. It is progressively more difficult to form and preserve highly metastable solid compounds where one of the elements exceeds its chemical solubility limit by more than 10 fold (i.e., 10 times). While previous non-equilibrium crystal growing techniques allow for creating metastable SnGe alloys with Sn concentration in excess of chemical solubility and up to 20 atomic % at a low growth temperatures in the state-of-the-art, creating and preserving GeSn metallic compounds with 30 or higher atomic % of tin is a challenge (reference can be made to "Direct Bandgap Group IV Epitaxy on Si for Laser Applications," by N. von den Driesch at el. in Chem. Mater., 27, 4693-4702 (2015)). In order to create and preserve such metastable metallic GeSn alloy, a very fast crystal re-growth method is employed according to embodiments. Fast annealing process, for example, a laser annealing process that has duration of less than 1 millisecond, enables crystal solid phase epitaxial re-growth at speeds from about 0.01 millimeter/second (mm/sec) to about 1 mm/sec. In some embodiments, the laser annealing process includes a nanosecond-scale laser melt annealing that liquefies the tin-implanted amorphous layer 162' followed by liquid phase epitaxial re-growth. In this case of the nanosecond-scale laser melt annealing, the speed of re-growth is from about 0.1 meter/second (m/sec) to about 10 m/sec or about 10,000 times faster. Using the nanosecond-scale laser melt annealing, faster crystal re-growth speeds traps or freezes tin atoms into germanium crystalline matrix preventing their agglomeration, segregation, and precipitation. Fast temperature cool down or quench of these fast anneal processes also preserves formed highly metastable GeSn-based metallic material 162. An example range of the duration of nanosecond-scale laser melt annealing can be from about 20 nanoseconds to about 1000 nanoseconds at the melting point of material 162'. The melting point of amorphous material 162' is about 100-200 C (Celsius) lower than the melting point of crystalline material 152. In addition, the presence of low-melting point tin in large quantities in material 162' can further lower its melting point. For instance, the amorphous intermix of Ge, Sn, and B in the layer 162' with about 65 atomic % Ge, about 34 atomic % Sn, and about 1 atomic % B has a melting point in between 600 C and 800 C while the melting point of material 152 is about 940 C. In addition, the preservation of highly metastable alloy 162 is aided by its small volume. Advantageously, the thickness of layers 162 and 152 is about equal or less than half of the contact trench opening 202 or is about equal or less than 10 nm for 20 nm-wide contact trenches 202.

Figure 8:
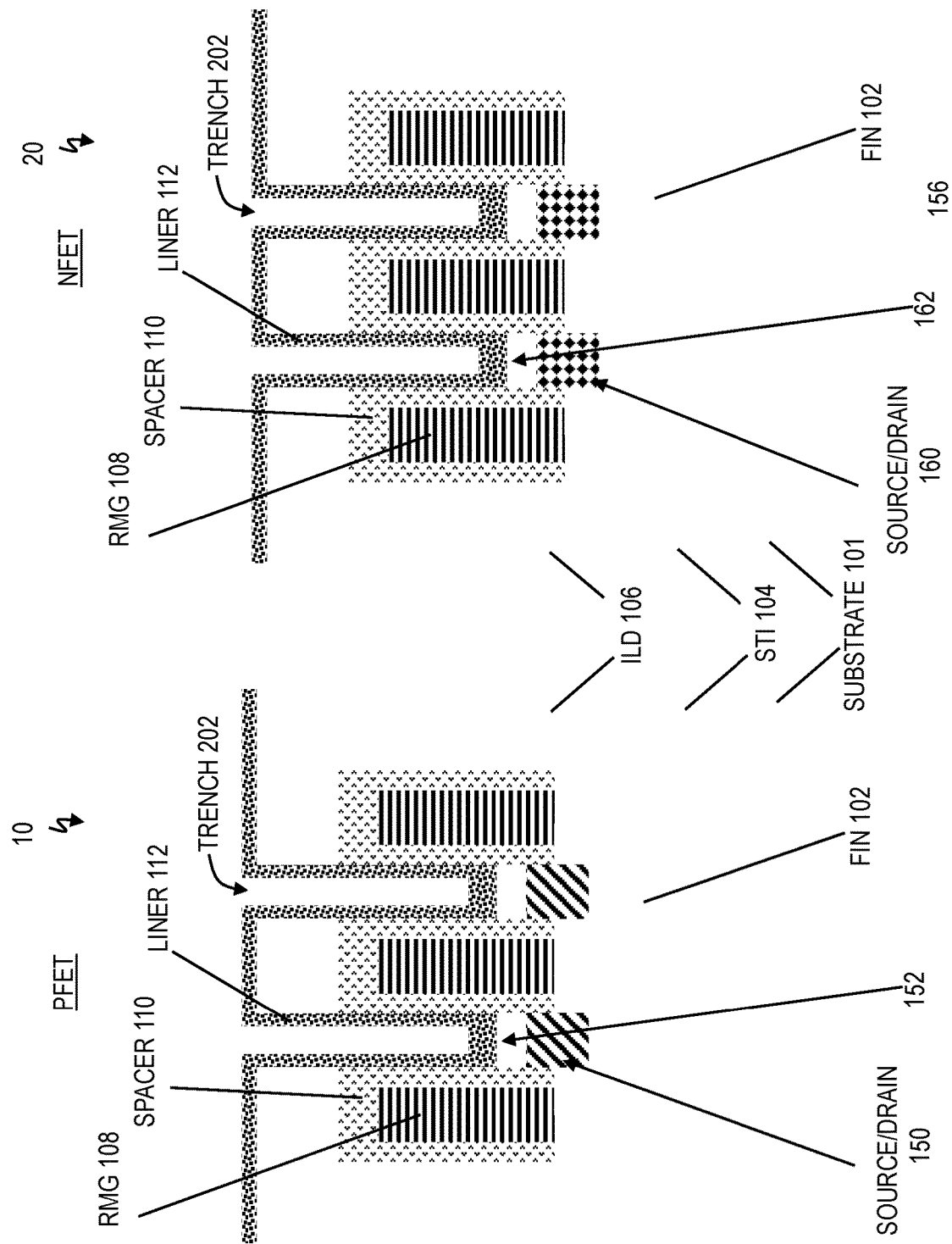
Figure 9:
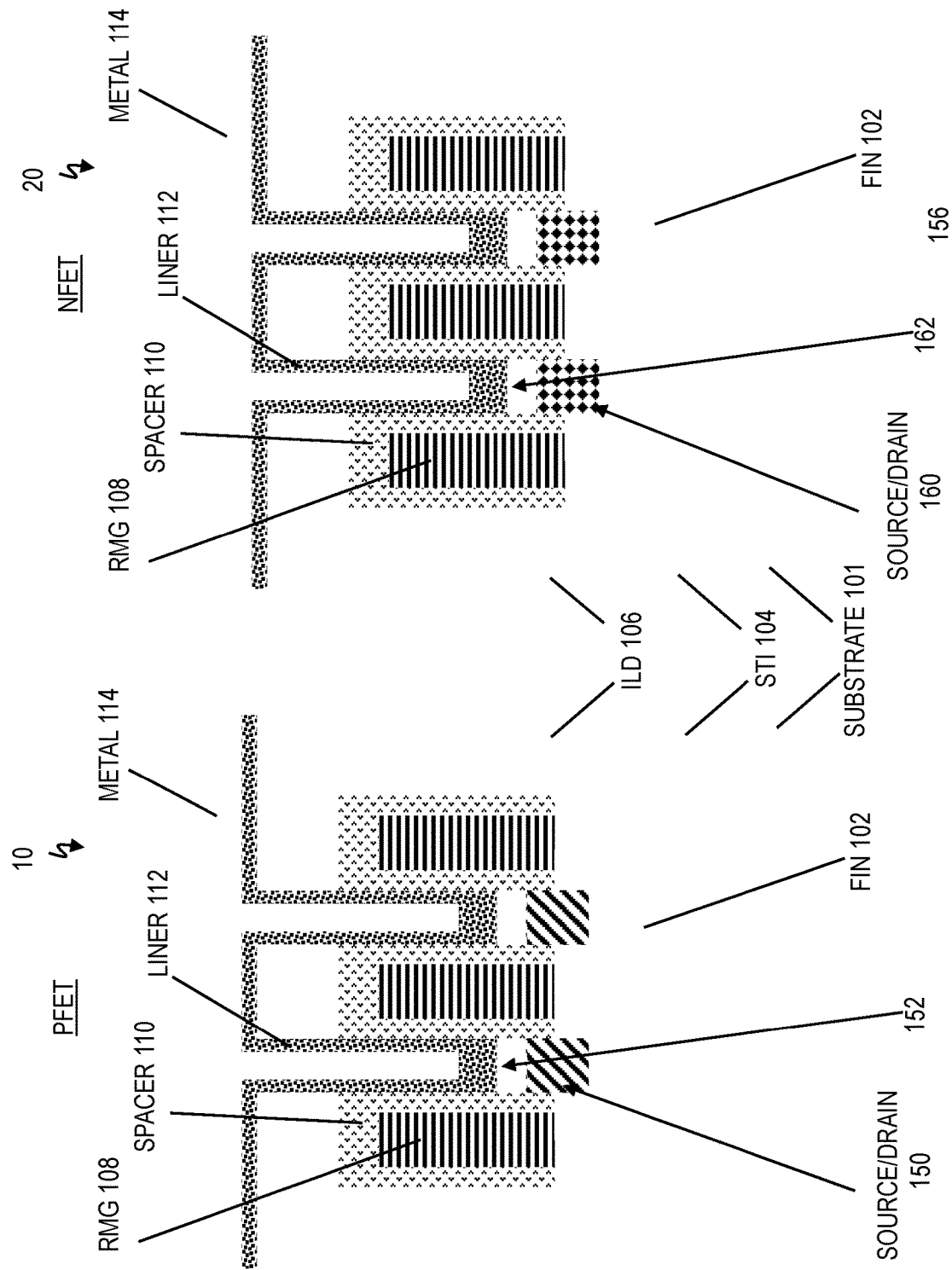
Figure 10:
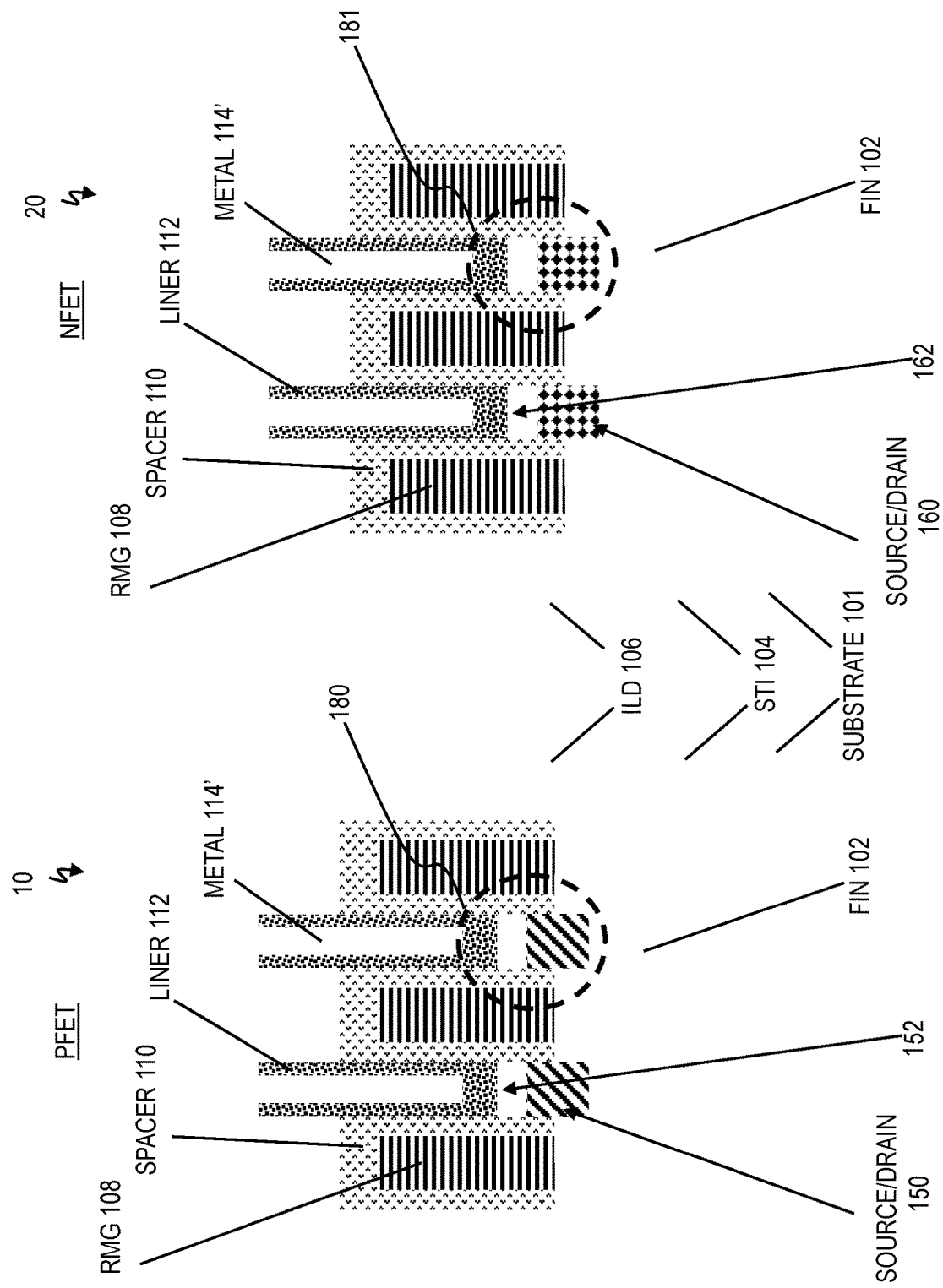

FIG. 8 is a cross-sectional view of the pFET device 10 and nFET device 20 illustrating deposition of a metallic liner layer 112 over exposed portions of the inter-level dielectric layer 106, the spacers 110, and the trench layers 152, 162 in the trenches 202, according to one or more embodiments. The metallic liner 112 is formed (simultaneously) in the trench 202 in both the pFET device 10 and the nFET device 20. In the illustrated exemplary embodiment, the metallic liner layer 112 includes, for example, a titanium metal followed by a metal-nitride material such as $TiN_x$. The liner 112 is optionally annealed to form a titanium germanide $TiGe_x$ or germo-silicide $TiSi_yGe_x$ at the interface (i.e., interfacial layer 190) of layers 152 and 112 in pFET device 10 in FIG. 1B and at the interface (i.e., interfacial layer 190) of layers 162 and 112 in nFET device 20 in FIG. 1D. The duration and temperature of this optional "silicidation" anneal process is selected to preserve metastable materials in layers 152, 160, and 162 while forming metallic germo-silicide as the interfacial layer 190 between layers 152 and 112 in pFET device 10 in FIG. 1B and between layers 162 and 112 in nFET device 20 in FIG. 1D. In some embodiments, the anneal is a millisecond anneal with the duration from about 100 microseconds to about 1 millisecond and peak temperature of from about 600 C to 850 C or below the melting point of material 162, whichever is lower. This optional "silicidation" anneal can be conducted immediately after forming liner 112 or after completing contact structure as shown in FIGS. 9-10. The interfacial layer 190 (if present) or liner 112 (if layer 190 is absent) and the adjacent layer 152 form a metal-semiconductor interface in the pFET device 10, while the interfacial layer 190 (if present) or liner 112 (if layer 190 is absent) and the adjacent metallic layer 162 form a metal-metal interface in the nFET device 20. The contact resistance associated with the metal-semiconductor interface in the pFET device 10 is reduced due to Fermi level pinning of metallic layer 190 (if present) or metallic liner 112 (if layer 190 is absent) to the Ge valence band of layer 152. The contact resistance associated with the metal-metal interface in the nFET device 20 is negligible with respect to contact resistance of metal-semiconductor interface between the layers 162 (metal) and 160 (semiconductor). Accordingly, the overall contact resistance of the pFET device 10 is improved while preserving the contact resistance of the nFET device 20.

FIG. 9 is a cross-sectional view of the pFET device 10 and nFET device 20 illustrating deposition of a conductive contact material 114 over the liner layer 112 according to one or more embodiments. The conductive contact material 114 is deposited in the trenches 202 (of FIG. 8). The conductive metallic material 114 can include any suitable metallic conductive material including, for example, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), other metallic-like interconnect materials such carbon nanotube, graphene, or any suitable combination of these materials.

FIG. 10 is a cross-sectional view of the pFET device 10 and nFET device 20 illustrating a planarization process that removes overburdened materials and forms conductive contacts 114'. The planarization process can include for example, a chemical mechanical polishing process. Following the planarization process, an annealing process can be performed, as discussed above.

Figure 11:
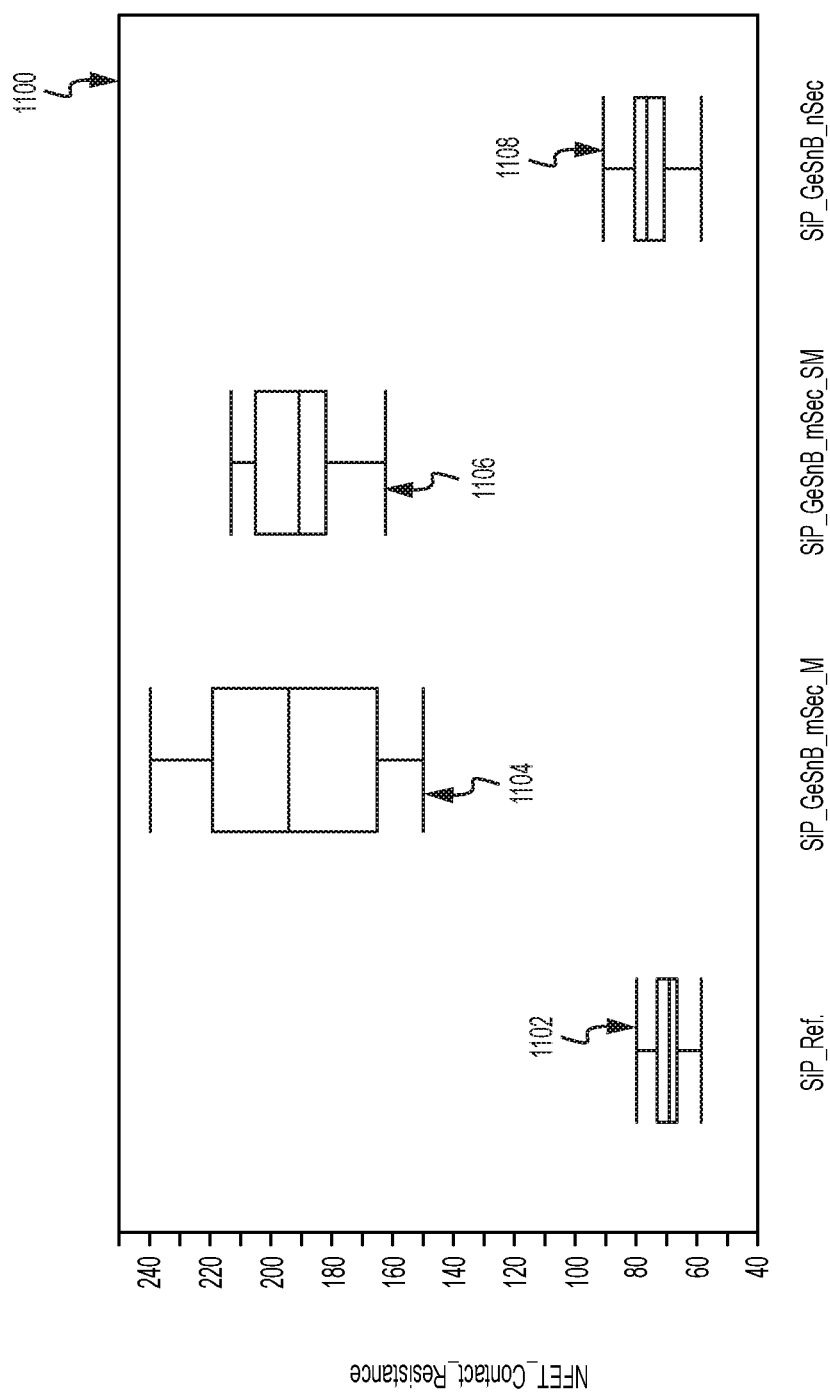
FIG. 11 is a chart of an exemplary nFET contact resistance fabricated according to one or more embodiments.

FIG. 11 is a chart 1100 (including experimental data) that demonstrates nFET combined contact resistance (including all contact interfaces) for an nFET device 20 fabricated in accordance with an exemplary embodiment. The S/D region 160 includes silicon doped with phosphorus (Si:P). The layer 152 is Ge in-situ doped with B grown to be about 10 nm thick or about half of the contact trench opening. The layer 162' is created by implanting Sn ions at 7 keV energy and $1.5 \times 10^{16}$ cm$^{-2}$ dose yielding average concentration of tin in layer 162' to be about $1.5 \times 10^{22}$ cm$^{-3}$ or about 34 atomic %. The reference cell of FIG. 11 labeled "SiP-Ref" 1102 skips formation of layers 152, 162', 162 and establishes a reference value for contact resistance between the metallic silicide layer 190 and S/D region 160.

The 3 experimental cells 1104, 1106, and 1108 of FIG. 11 represent 3 different methods of converting layer 162' into layer 162 with the goal of creating metallic, highly metastable GeSn-based alloy. The cell labeled "SiP—GeSnB-mSec-M" 1104 used millisecond laser anneal with laser exposure duration of about 0.5 msec and peak temperature above the melting point of crystalline GeSn alloy (about 850 C). The cell labeled "SiP—GeSnB-mSec-SM" 1106 used millisecond laser anneal with laser exposure duration of about 0.5 msec and peak temperature below the melting point of crystalline GeSn alloy (about 700 C). The cell labeled "SiP—GeSnB-nSec" 1108 used nanosecond laser melt anneal with laser exposure duration of about 100 nsec and peak temperature above melting point of amorphous GeSn alloy (about 750 C). Other elements or processes such liner 112, conductive metal 114, silicidation anneal, and planarization steps are common between the cells. The silicidation anneal was a laser anneal with the laser exposure duration of about 0.5 msec and peak temperature of about 800 C. The contact resistance of the cell labeled "SiP—GeSnB-nSec" 1108 is equal to the contact resistance of the reference cell labeled "SiP-Ref" 1102, thereby demonstrating a successful conversion of p-type Ge:B layer 152 into the metallic $Ge_{0.66}Sn_{0.34}$:B layer 162 (where B is less than 1% atomic percent) by nanosecond-scale laser melt annealing and demonstrating the contact resistance equivalence between $TiSi_x$—SiP interface and $Ge_{0.66}Sn_{0.34}$:B—Si:P interface. In this example, the conversion of layer 162' into layer 162 by means of millisecond laser annealing was not successful due to significantly lower speed of re-growth.

FIG. 12A is a flow chart 1200 of a method for (simultaneously) fabricating a pFET device 10 and an nFET device 20 on the same substrate 101 according to one or more embodiments. Reference can be made to FIGS. 1-10.

At block 1202, a contact trench 202 is formed through an inter-level dielectric layer 106 and a spacer layer 110 in which the inter-level dielectric layer 106 is formed over the spacer layer 110. The contact trench 202 exposes a p-type source/drain region 150 of the pFET device 10 and exposes an n-type source/drain region 160 of the NFET device 20. A gate stack 108 is included within the spacer layer 110.

At block 1204, a p-type alloyed layer 152 is formed on top of the p-type source/drain region 150 in the pFET device 10 and on top of the n-type source/drain region 160 of the nFET device 20.

At block 1206, the p-type alloyed layer 152 on top of the n-type source/drain region 160 of the nFET device 20 is converted into a metallic alloyed layer 162 on top of the n-type source/drain region 160.

At block 1208, a metallic liner layer 112 is formed in the contact trench 202 such that the metallic liner layer 112 is on top of the p-type alloyed layer 152 of the pFET device 10, on top of the metallic alloyed layer 162 of the nFET device 20, and on top of the inter-level dielectric layer 106.

A conductive metallic plug 114' is formed on top of the metallic liner layer 112 so as to fill the contact trench 202. The p-type source/drain region 150 is a p-type source/drain material. The n-type source/drain region 160 is an n-type source/drain material. The p-type source/drain material is SiGe doped with B. The n-type source/drain material is Si doped with P. The p-type alloyed layer 152 is Ge doped with Ga, B, Al, In, Sn and/or any combination thereof.

Converting the p-type alloyed layer 152 on top of the n-type source/drain region 160 of the nFET device 20 into the metallic n-type-compatible alloyed layer 162 includes: protecting the pFET device by forming a block 302 on top of the pFET device 10 and performing ion implantation to mix and amorphize the p-type alloyed layer with additional elements creating an amorphous layer 162'. The additional elements of the material include Sn and P. The amorphous layer 162' is an intermix of Ge, Sn, Ga, and P as a result of the ion implantation. The amorphous layer 162' includes Ge with about 60 atomic %, Sn (tin) and P with up to 10 atomic %. The atomic % of P is greater that an atomic % of Ga. If Ga is 5 atomic %, then P is greater than 5 atomic %.

In one implementation, the amorphous layer 162' includes Ge with about 55-60 atomic %, Sn with about 30 atomic %, and P with up to 10 atomic % so as to total 100 atomic %.

The metallic alloyed layer 162 was doped with dopants selected from a group consisting of p-type dopants (Ga, B, Al, In), n-type dopants (P, As, Sb), and/or any combination of p-type and n-type dopants. Because the alloyed layer 162 is a metallic metastable alloy (i.e., has now been converted to a metal), the p-type and/or n-type dopants do not negatively affect the contact resistance between the metallic alloyed layer 162 and the metal liner 112.

Converting the p-type alloyed layer 152 on top of the n-type source/drain region 160 of the nFET device 20 into the metallic alloyed layer 162 further includes: removing the block 302 protecting the pFET device 10 and annealing the amorphous layer 162' to form the metallic alloyed layer 162. Annealing the amorphous layer 162' to form the metallic alloyed layer creates a metastable GeSnGaP alloy.

Annealing the amorphous layer 162' to form the metallic alloyed layer 162 includes performing a laser annealing process that has a duration of less 1 millisecond thereby enabling crystal re-growth of the metallic alloyed layer 162, wherein the metallic alloyed layer 162 is metastable. Annealing the amorphous layer 162' to form the metallic alloyed layer includes performing nanosecond-scale laser melt annealing that liquefies the amorphous layer, which subsequently causes liquid phase epitaxial re-growth of the metallic alloyed layer 162, where the metallic alloyed layer is metastable.

A method of making a metallic metastable alloy (such as the metallic metastable alloy 162) according to one or more embodiments. The method includes forming an amorphous layer of Ge, implanting Sn and a dopant "J", and performing a nanosecond-scale laser metal anneal that causes the amorphous layer to liquefy and causes liquid phase epitaxial re-growth, thereby resulting in a metallic metastable GeSn"J" alloy in which Ge is greater than 60 atomic %, Sn is greater than 30 atomic %, and J is a remainder atomic % so as to total 100 atomic %.

Additionally, the dopant "J" is a Group III dopant, a Group V dopant, and/or a combination of the Group III and Group V dopants. The metallic metastable GeSn"J" alloy includes Ge of about 65 atomic %, Sn of about 34 atomic %, and J of about 1 atomic % so as to total 100 atomic %.

While aspects of the exemplary embodiment are shown and described with respect to a p-type finFET (pFINFET) and an n-type finFET (nFINFET), it is to be understood that aspects of the present invention can be employed with different geometrical orientations and shapes of transistor active region or its channel such as planar, surround-gate FETs, multiple-gate FETs, nano-wire or nano-sheet FETs, and vertical FETs.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for fabricating a p-type field effect transistor (pFET) device and an n-type field effect transistor (nFET) device, the method comprising:
    forming a contact trench through an inter-level dielectric layer and a spacer layer, the inter-level dielectric layer being formed over the spacer layer, the contact trench exposing a p-type source/drain region of the pFET device and exposing an n-type source/drain region of the nFET device, wherein a gate stack is included within the spacer layer;
    forming a p-type alloyed layer on top of the p-type source/drain region of the pFET device and on top of the n-type source/drain region of the nFET device;
    converting the p-type alloyed layer on top of the n-type source/drain region of the nFET device into a metallic alloyed layer on top of the n-type source/drain region, the converting comprising protecting the pFET device by forming a block on top of the pFET device, performing ion implantation of ions of material to convert the p-type alloyed layer into an amorphous layer, removing the block protecting the pFET device, and annealing the amorphous layer to form the metallic alloyed layer; and
    forming a metallic liner layer in the contact trench such that the metallic liner layer is on top of the p-type alloyed layer of the pFET device and on top of the metallic alloyed layer of the nFET device.

2. The method of claim 1, further comprising forming a conductive contact on top of the metallic liner layer so as to fill the contact trench.

3. The method of claim 1, wherein the p-type source/drain region is a p-type source/drain material; and
    wherein the n-type source/drain region is an n-type source/drain material.

4. The method of claim 3, wherein the p-type source/drain material is SiGe doped with B.

5. The method of claim 3, wherein the n-type source/drain material is Si doped with P.

6. The method of claim 1, wherein the p-type alloyed layer is Ge doped with dopants, the dopants being selected from a group consisting of Ga, B, Al, In, or any combination thereof.

7. The method of claim 1, wherein the ions of material include Sn and P.

8. The method of claim 1, wherein the amorphous layer is an intermix of Ge, Sn, Ga, and P as a result of the ion implantation.

9. The method of claim 8, wherein the amorphous layer includes Ge with about 55-60 atomic %, Sn with about 30 atomic %, and P with up to 10 atomic % so as to total 100 atomic %.

10. The method of claim 9, wherein the atomic % of P is greater than an atomic % of Ga.

11. The method of claim 1, wherein the metallic alloyed layer was doped with dopants selected from a group consisting of p-type dopants, n-type dopants, or a combination of the p-type and the n-type dopants.

12. The method of claim 1, wherein annealing the amorphous layer to form the metallic alloyed layer creates a metastable GeSnGaP alloy.

13. The method of claim 1, wherein annealing the amorphous layer to form the metallic alloyed layer comprises performing a laser annealing process to enable crystal re-growth of the metallic alloyed layer.

14. The method of claim 13, wherein the metallic alloyed layer is metastable.

15. The method of claim 1, wherein annealing the amorphous layer to form the metallic alloyed layer comprises performing a laser annealing process that has a duration of less 1 millisecond thereby enabling crystal re-growth of the metallic alloyed layer, wherein the metallic alloyed layer is metastable.

16. The method of claim 1, wherein annealing the amorphous layer to form the metallic alloyed layer comprises performing a nanosecond-scale laser melt annealing that liquefies the amorphous layer and causing liquid phase epitaxial re-growth of the metallic alloyed layer, wherein the metallic alloyed layer is metastable.

* * * * *